United States Patent [19]

Nobutani et al.

[11] Patent Number: 4,964,962
[45] Date of Patent: Oct. 23, 1990

[54] METHOD FOR FORMING CONDUCTING METAL LAYER ON INORGANIC SUBSTRATE

[75] Inventors: Tohru Nobutani; Atsuhiro Nakamoto; Hideo Izumi; Takahiro Miyano, all of Kadoma, Japan

[73] Assignee: Matsushita Electric Works, Ltd., Osaka, Japan

[21] Appl. No.: 416,406

[22] Filed: Oct. 3, 1989

[30] Foreign Application Priority Data

| Oct. 8, 1988 | [JP] | Japan | 63-254658 |
| Oct. 8, 1988 | [JP] | Japan | 63-254659 |
| Oct. 8, 1988 | [JP] | Japan | 63-254660 |
| Oct. 8, 1988 | [JP] | Japan | 63-254661 |
| Oct. 8, 1988 | [JP] | Japan | 63-254662 |

[51] Int. Cl.$^5$ ............................................. C23C 14/34
[52] U.S. Cl. ........................ 204/192.3; 204/192.15
[58] Field of Search ................ 204/192.15, 192.17, 204/192.3; 156/643, 646

[56] References Cited

U.S. PATENT DOCUMENTS

| 3,835,007 | 9/1974 | Ferat et al. | 204/192.3 X |
| 3,941,692 | 3/1976 | Tanaka et al. | 204/192.3 X |
| 3,945,903 | 3/1976 | Svendor et al. | 204/192.3 X |
| 4,342,632 | 8/1982 | Heim et al. | 204/192.12 X |
| 4,597,828 | 7/1986 | Tadros | 204/192.3 X |
| 4,647,361 | 3/1987 | Bauer | 204/298 |
| 4,702,941 | 10/1987 | Mitchell et al. | 204/192.15 X |

OTHER PUBLICATIONS

Article: "Vakuum-Technik", vol. 37, No. 6, 1988 (pp. 162-175) High-Rate Sputtering Technology and its Application in Different Industrial Fields.

*Primary Examiner*—Nam X. Nguyen
*Attorney, Agent, or Firm*—Burns, Doane, Swecker & Mathis

[57] ABSTRACT

A method for forming a conducting metal layer on an inorganic substrate is to heat the inorganic substrate accommodated in a vacuum vessel of sputtering device in which a high degree of vacuum is attained, to lead into the vacuum vessel a discharge gas as regulated to be at a predetermined pressure, to apply a high frequency power with the inorganic substrate made as a target, to interrupt the power to regulate the discharge gas to be at a predetermined pressure relatively low, and to apply DC power with a conductive metal member made as a target for thereby forming the conducting metal layer on the inorganic substrate. The metal layer formation on the inorganic substrate is thereby simplified enough for improving the producibility in industrial scale and is still capable of attaining a satisfactory bonding strength between the metal layer and the substrate.

13 Claims, 4 Drawing Sheets

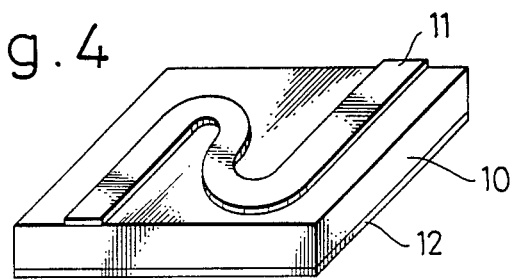
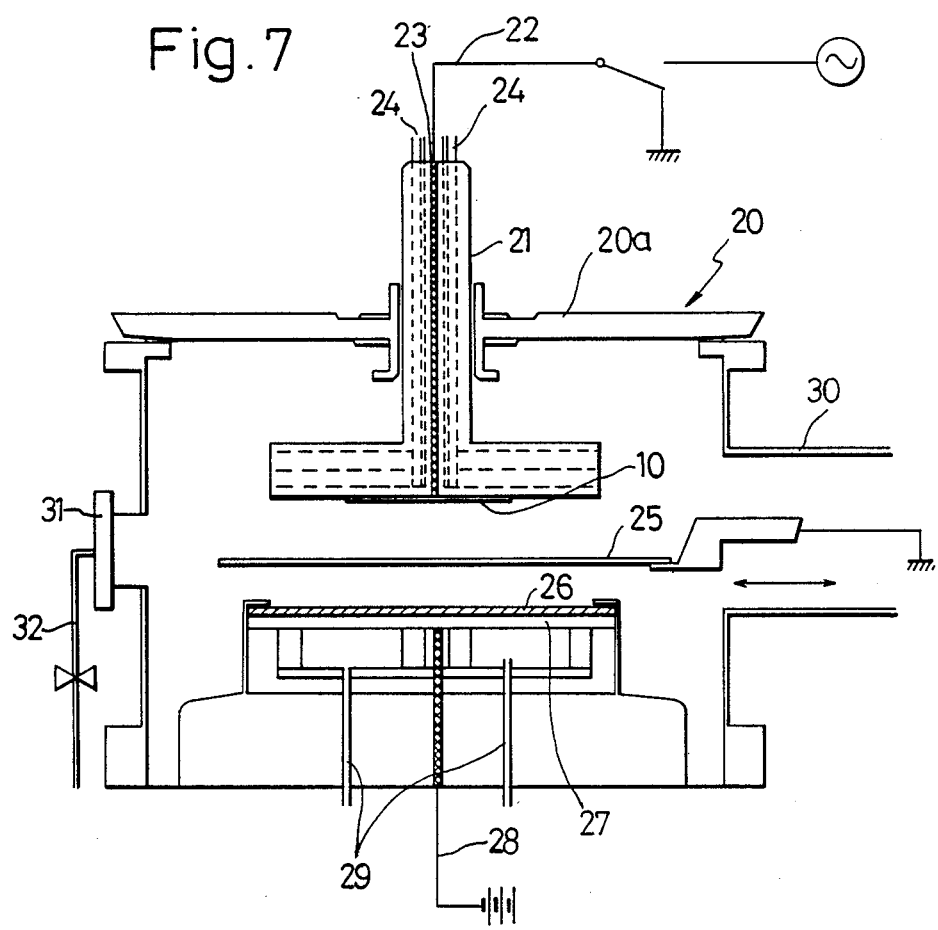

METHOD FOR FORMING CONDUCTING METAL LAYER ON INORGANIC SUBSTRATE

BACKGROUND ART OF THE INVENTION

This invention relates to a method for forming a conducting metal layer on an inorganic substrate, in particular, ceramic substrate, through a sputtering process.

The inorganic substrate having the conducting metal layer formed by means of the method of the kind referred to can be effectively utilized as such an electronic part as ceramic wiring circuit board.

DISCLOSURE OF PRIOR ART

There have been suggested various methods of tightly bonding the conducting metal layer onto the ceramic substrate for forming the conducting metal layer on the ceramic substrate having flat and smooth surfaces. In Japanese Patent Application Laid-Open Publication No. 52-48527 of Tabata et al, for example, there has been shown a method in which the surface of the substrate made of a ceramic or the like is subjected to an etching process with a concurrent use of hard abrasive to be roughened with minute unevenness given in the order of 2 to 5 $\mu$m, and such conductive material as copper or the like material is provided as a layer on the surface-roughened substrate through a vacuum metallizing, sputtering or the like process. According to this method of Tabata et al, however, there have been involved such drawbacks that the surface roughening required for the substrate surface renders manufacturing steps to become complicated enough for increasing manufacturing costs, and that air bubbles or pin holes are likely to occur between the substrate and the copper layer so as to cause the layer to be corroded This known method has not been also fully satisfactory in respect that the bonding strength between the substrate and the copper layer is 0.006 Kg5/mm$^2$ (0.024 Kgf/2 mm square).

Further, in U.S. Pat. No. 4,342,632 of Heim et al, there has been shown a method in which a ceramic substrate is subjected to a sputter etching, a sputtering is carried out to form sequentially Cr, Mo and Cu layers on the substrate, and they are calcined at 1,000° C. for 10 minutes, to form the copper layer on the ceramic substrate. However, this method of Heim et al has been also involving such problems that the manufacturing steps are complicated due to the sputtering required to be carried out at several stages so as to render the manufacturing costs to be high, and that other metal layers of a relatively larger resistance than the copper layer have to be formed between the substrate and the copper layer so as to render the high frequency loss to be large and to limit the suitable use of the product.

Even when the conducting metal layer is formed on the inorganic substrate on the basis of these known method, further, it has been generally impossible to attain any product fully satisfactory in respect of the mass producibility in industrial scale and the bonding strength between the substrate and the metal layer.

FIELD OF ART

An object of the present invention is, therefore, to provide a method for forming the conducting metal layer on the inorganic substrate, which method is relatively simpler in the required manufacturing steps, high in the mass producibility in the industrial scale, and still capable of attaining sufficiently satisfactory bonding strength of the conducting metal layer with respect to the inorganic substrate.

According to the present invention, this object can be realized by a method for forming a conducting metal layer on an inorganic substrate by subjecting the inorganic substrate to an ion bombardment within a vacuum vessel of a sputtering device to clean the surface of the inorganic substrate, and forming the conducting metal layer through a sputtering process on the cleaned surface of the substrate, characterized in that the inorganic substrate housed within the vacuum vessel is heated at a temperature above 140° C. while keeping the vacuum vessel at a high degree of vacuum of less than $3\times 10^{-4}$ Pa, a rare gas is led into the vacuum vessel as a discharge gas under a pressure of 2 to 20 Pa, a high frequency power is applied to the inorganic substrate as a target for carrying out the ion bombardment, the application of power is interrupted while adjusting the pressure of the rare gas to be 0.2 to 2.0 Pa, and a direct current power applied to a copper or the like conducting metal material as a target for sputtering-forming the conducting metal layer to render the rate of forming conducting metal film on the substrate to be more than 1.4 $\mu$m/min.

Other objects and advantages of the present invention shall be made clear in following explanation of preferred embodiments of the invention.

BRIEF EXPLANATION OF DRAWINGS

FIG. 4 shows in a perspective view an aspect in which the method for forming the conducting metal layer on the inorganic substrate according to the present invention is worked;

FIG. 7 shows schematically the device employed for carrying out the method for forming the conducting metal layer on the inorganic substrate according to the present invention;

Figure 1:
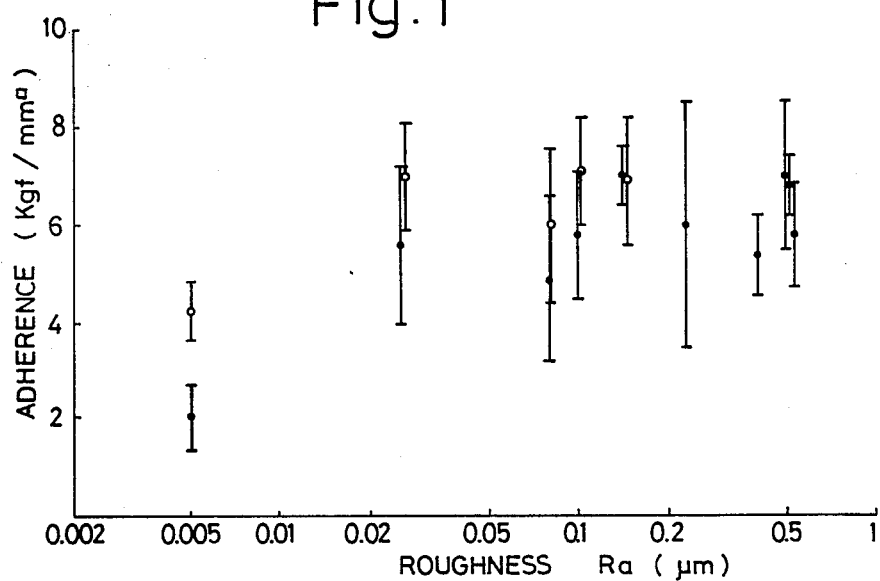
FIG. 1 is a diagram showing the relationship between the surface roughness of the inorganic substrate and the bonding strength attained in the method for forming the conducting metal layer on the inorganic substrate according to the present invention.

While the present invention shall now be explained to details with reference to embodiments of the invention, it should be appreciated that the intention is not to limit the invention only to such embodiments but rather to include all modifications, alterations and equivalent arrangements possible within the scope of appended claims.

DISCLOSURE OF PREFERRED EMBODIMENTS

For the inorganic substrate employed in the present invention, a ceramic or glass consisting preferably of $Al_2O_3$, $SiO_2$, MgO, CaO, ZnO, SiC, $Si_3N_4$ or AlN respectively alone or in a mixture of two or more of them may be employed, and the inorganic substrate is prepared with the surface roughness set to be preferably 0.005 to 0.1 μm. It has been found that, when the surface roughness of the substrate is larger than this range, there arises a tendency of a remarkable deterioration in the high frequency characteristics, while a smaller surface roughness than the above range renders a precise abrasive step to be required to show a tendency of lowering the industrial producibility.

The inorganic substrate is first subjected to a preliminary treatment for removing any contamination due to relatively larger particles, while this treatment may be omitted if the substrate is sufficiently clean. The treatment is a socalled burn-out treatment which is carried out by heating the substrate at 900° to 1,200° C. for more than 2 hours in the atmosphere of air. When the heating temperature is below this range, it is likely that any organic substrate adhering to the substrate remains after the preliminary treatment, whereas a heating temperature higher than the range causes part of composition of the substrate to be varied. Then, the inorganic substrate is accommodated within a vacuum vessel while keeping the substrate not to be contaminated any more, the vessel being highly vacuumed so that the total pressure of residual gas containing oxygen molecules, water molecules, oxygen ions, hydroxyl ions and the like will be less than $3 \times 10^{-4}$ Pa while such a discharging gas of rare gas as Ar gas preferably is led into the vessel to attain a pressure of 2–20 Pa, while Xe, Kr, Ne or the like may also be used as the rare gas. When in this case the Ar gas pressure is lower than the above range, the discharging efficiency in the highly vacuumed atmosphere is deteriorated, whereas the pressure higher than the range causes an abnormal discharge to locally take place so as to have the substrate damaged and the discharge made unstable. Further within the vacuum vessel, the inorganic substrate is subjected to a heating so that its surface temperature will be at a constant temperature in a range of 140°–300° C. so as to have any water content within the substrate evaporated and to have intermolecular aggregation force between the substrate and $H_2O$, $O_2$ gas or the like deteriorated. When this heating temperature is lower than the particular range, the removal of water, $O_2$ gas or the like adhering to the substrate becomes insufficient whereas a higher heating temperature will render a required heating time prolonged too much and the producibility lowered.

With the inorganic substrate kept in the vacuum vessel under the foregoing condition, a high frequency power of a legal level of 13 MHz is applied with respect to the substrate as a target so as to achieve a constant power density in a range of 0.1–1.6 W/cm², and an ion irradiation is carried out with respect to the surface of the substrate by means of the discharge gas ionized by the high frequency discharge. Thus, ions of the discharge gas are caused to collide with the substrate so that the socalled ionic etching will take place, any foreign matter adhering to the substrate surface is driven away, and any contamination of the substrate surface can be eliminated. Due to the collision of the ions of the discharge gas with the substrate surface, the latter is made uneven or, in other words, a microetching is thereby attained with respect to the substrate surface. When the power density is of a value less than the above range, the effect of removing any contamination is thereby lowered, whereas the density more than the range renders the ionic microetching to be too strong in its action, and the substrate surface is to be excessively roughened. With the ion irradiation onto the substrate surface, the energy of ion movement is partly converted into heat energy to have the temperature of the substrate elevated so as to render the substrate surface more active. The ion irradiation is to be carried out for a fixed time period in a range for preventing the ionic etching from being excessive. It is preferable in certain cases, further, that the substrate surface will have a roughness adjusted to be 0.005 to 0.1 μm by means of an abrasion.

Next, a layer of such conducting metal as copper, silver or gold, preferably copper, is formed on the substrate surface to be of a thickness, for example, 5–35 μm by means of a sputtering process. In this case, an oxygen-less copper of a purity of, for example, more than 99.9% is employed as the target. The Ar gas employed as the discharge gas is kept at a constant pressure in a range of 0.2 to 2.0 Pa, a DC power is supplied so as to render the power density to be at a constant value preferably in a range of 10 to 50 W/cm², and the sputtering is thereby carried out. A proper discharging is made to take place with the Ar gas pressure maintained in the foregoing range, and the minutely fine unevenness formed on the substrate surface through the microetching process increased the surface area, whereby the conducting metal layer formed on the substrate surface is caused to intrude into minute recesses of the uneven substrate surface, whereby the bonding strength of the conducting metal layer with respect to the surface of the inorganic substrate can be effectively increased. Further, it is made possible to elevate the sputtering efficiency by setting the power density to be relatively higher as in the above to have the discharge power enlarged. By elevating the sputtering efficiency, the film forming rate in forming the conducting metal layer can be increased, the producibility in the industrial scale can be thereby improved, and the bonding strength of the conducting metal layer with respect to the inorganic substrate can be enlarged while improving the conductivity to be extremely excellent. It will be also desirable to apply the high frequency to the substrate simultaneously with the starting of discharge upon the sputtering, so a to achieve a high frequency biasing.

In addition, during the sputtering process carried out as in the above, the conducting metal atoms reaching the inorganic substrate are increased in the number, the temperature rise in the substrate due to the conversion of the moving energy of the conducting metal atoms on the substrate will also be enhanced, and the conducting metal layer is formed in a state where the substrate surface is maintained at a high temperature. Here, it should be appreciated that the higher temperature of the substrate surface allows the conducting metal layer to grow in a structure closer to that of polycrystal, and the conducting metal layer thus formed is excellent in the mechanical strength. Since the linear expansion coefficient of the conducting metal layer of, for example, copper($1.8 \times 10^{-5} K^{-1}$) is generally larger than that of the substrate, the conducting metal layer is inherently made to contract more than the inorganic substrate in a normal temperatures, so that the internal stress will act as a tensile stress while the internal stress of the substrate act as a compressional stress. Consequently, the conducting metal layer is made more durable against the tensile stress while the substrate is durable against the compressional stress, whereby any deformation accompanying the internal stress can be reduced, the conducting metal layer can be prevented from involving any problems of bubbling, blistering and peeling and the bonding strength of the conducting metal layer with respect to the inorganic substrate can be remarkably improved.

Various examples of the method for forming the conducting metal layer on the inorganic substrate according to the present invention, as well as comparative examples, shall now be referred to in the followings:

In the respective examples and comparative examples, there have been employed commonly as the sputtering device the one of a magnetron system (SPF-313H) of a Japanese manufacturer NICHIDEN ANELBA, and as the conducting metal layer an oxygen-less copper of the purity of 99.99% and a diameter of 200 mm.

EXAMPLE 1

As the inorganic substrate, an alumina plate of 0.8 mm thick, 4 inches square wide and a surface roughness of 0.5 μm, a product by a Japanese manufacturer MATSUSHITA ELECTRIC WORKS, LTD. was prepared, this alumina plate was accommodated within a vacuum vessel of the sputtering device and was heated therein to be 200° C. under the degree of vacuum $2 \times 10^{-4}$ Pa achieved in the vessel. Ar gas was then led into the vacuum vessel under a pressure of 10 Pa, a high frequency power of 13 MHz was applied to the alumina substrate at 200 W for 10 minutes (a power density of 0.64 W/cm$^2$), the high frequency power was thereafter interrupted, and the Ar gas pressure was regulated to be 0.5 Pa. Then, a DC power of 4 KW (power density 12.7 W/cm$^2$) was applied onto the alumina substrate with oxygen-less copper made as a target, and a copper layer was formed on the alumina substrate through the sputtering process at a film forming rate of 1.4 μm/min. and to be of the final thickness of 10 μm.

The alumina substrate having the thus formed copper layer was subjected to such two different tests as follows:

Test 1 (Test of Bonding Strength at Normal Temperature)

A conducting circuit pattern of 2×2 mm was formed by a known etching process in the copper layer, a tin-plated copper wire of a diameter of 0.7 mm and bent substantially into L-shape was soldered to the circuit pattern, the alumina substrate was fixedly held, and then the copper wire was pulled in a direction perpendicular to the substrate by means of a tension tester AUTOGRAPH by a Japanese manufacturer SHIMADZ, to measure the peel-off strength. It is considered in this connection that a utilizable strength for this test is more than 4 Kgf per 2 mm sqyare.

Test 2 (Test of Bonding Strength at High Temperature)

After forming a conducting circuit pattern of 2×2 mm by the known etching process in the copper layer, the substrate having such pattern was placed in a furnace of a nitrogen atmosphere (containing less than 5 ppm of oxygen) and was heated at 950° C. for 10 minutes, a tin-plated copper wire of a diameter of 0.7 mm was soldered to the circuit pattern in the same manner as in Test 1, the wire was pulled by the tension tester in perpendicular direction with respect to the substrate held fixedly, and the bonding strength was measured. Any occurrence of the blister at boundary surface between the copper layer and the substrate was investigated. It is considered that the utilizable strength for this test is more than 2 Kgf per 2 mm square.

EXAMPLES 2–21 and COMPARATIVE EXAMPLES 1 and 2

The respective Examples and Comparative Examples were carried out in the same manner as in EXAMPLE 1 with such material and conditions as in a following Table employed. In Example 20, the alumina substrate was placed in a box-shaped electric furnace, heated at 1,100° C.(in Example 21, 900° C.) for 3 hours in an atmosphere of air and subjected to a preliminary treatment. It was required 4 hours for temperature rise and 12 hours for temperature lowering. After the heat treatment, the alumina substrate was placed in a bag of polyethylene and was preserved within a desiccator along with silica gel as a drying agent, before being used for the Example.

Respective substrates having a copper layer formed through the respective Examples and Comparative Examples were subjected to the foregoing Tests 1 and 2, and test results have been also presented in the Table along with the results of Example 1.

TABLE

|  |  | Substrate | Roughness (μm) | Ion Irradiation | | | | | Sputtering | | | Test | |
|---|---|---|---|---|---|---|---|---|---|---|---|---|---|
|  |  |  |  | Vac. Deg. (Pa) | Subst. Temp. (°C.) | Ar Press. (Pa) | Elec. Power (W) | Time (Min.) | Regul. Ar Pres. (Pa) | DC Pow. (KW) | Film Form. Speed (μm/min.) | 1 | 2 |
| Example | 1 | Al$_2$O$_3$ | 0.5 | $2.0 \times 10^{-4}$ | 200 | 10 | 200 | 10 | 0.5 | 4 | 1.4 | ≧8.5 | 7–8 |
|  | 2 | Al$_2$O$_3$ | 0.5 | $1.5 \times 10^{-4}$ | 180 | 10 | 200 | 10 | 0.5 | 4 | 1.4 | 7–8 | 7–8 |
|  | 3 | Al$_2$O$_3$ | 0.5 | $1.8 \times 10^{-4}$ | 230 | 10 | 150 | 10 | 0.5 | 4 | 1.4 | ≧8.5 | 7–8 |
|  | 4 | Al$_2$O$_3$ | 0.5 | $2.5 \times 10^{-4}$ | 150 | 10 | 200 | 7 | 0.5 | 4 | 1.4 | 6–8 | 5–6 |
|  | 5 | Al$_2$O$_3$ | 0.5 | $5.0 \times 10^{-5}$ | 200 | 10 | 200 | 10 | 0.5 | 4 | 1.4 | ≧8.5 | 7–8 |
|  | 6 | Al$_2$O$_3$ | 0.5 | $2.0 \times 10^{-4}$ | 250 | 10 | 200 | 10 | 0.5 | 5 | 1.8 | 8 | 8 |
|  | 7 | Al$_2$O$_3$ | 0.5 | $2.0 \times 10^{-4}$ | 270 | 2 | 500 | 1 | 0.5 | 15 | 3.0 | ≧8.5 | 7–8 |
|  | 8 | Al$_2$O$_3$ | 0.5 | $2.0 \times 10^{-4}$ | 300 | 10 | 200 | 10 | 0.5 | 15 | 3.0 | ≧8.5 | 7–8 |
|  | 9 | Al$_2$O$_3$ | 0.5 | $2.0 \times 10^{-4}$ | 250 | 20 | 63 | 10 | 0.5 | 30 | 6.0 | 6–8 | 6–7 |
|  | 10 | Al$_2$O$_3$ | 0.5 | $2.0 \times 10^{-4}$ | 250 | 5 | 200 | 10 | 0.5 | 15 | 3.0 | ≧8.5 | 7–8 |
|  | 11 | Al$_2$O$_3$ | 0.5 | $2.0 \times 10^{-4}$ | 250 | 5 | 200 | 10 | 0.2 | 15 | 3.0 | ≧8.5 | 7–8 |
|  | 12 | Al$_2$O$_3$ | 0.5 | $2.0 \times 10^{-4}$ | 250 | 5 | 200 | 10 | 2.0 | 15 | 3.0 | 7–8 | 7–8 |
|  | 13 | Al$_2$O$_3$ | 0.07 | $2.2 \times 10^{-4}$ | 200 | 10 | 200 | 5 | 0.5 | 4 | 1.4 | ≧8.5 | 7–8 |
|  | 14 | Al$_2$O$_3$ | 0.05 | $2.2 \times 10^{-4}$ | 200 | 10 | 200 | 5 | 0.5 | 4 | 1.4 | ≧8.5 | 7–8 |

TABLE-continued

|  |  | Substrate | Roughness (μm) | Ion Irradiation | | | | | Sputtering | | | Test | |
|---|---|---|---|---|---|---|---|---|---|---|---|---|---|
|  |  |  |  | Vac. Deg. (Pa) | Subst. Temp. (°C.) | Ar Press. (Pa) | Elec. Power (W) | Time (Min.) | Regul. Ar Pres. (Pa) | DC Pow. (KW) | Film Form. Speed (μm/min.) | 1 | 2 |
|  | 15 | $Al_2O_3$ | 1.1 | $2.2 \times 10^{-4}$ | 200 | 10 | 200 | 5 | 0.5 | 4 | 1.4 | ≧8.5 | 7–8 |
|  | 16 | ALN | 0.4 | $2.2 \times 10^{-4}$ | 200 | 10 | 200 | 5 | 0.5 | 4 | 1.4 | 7–8 | 7–8 |
|  | 17 | Pyrex | 0.01 | $1.8 \times 10^{-4}$ | 250 | 10 | 200 | 3 | 0.5 | 4 | 1.4 | 4–5 | 2–3 |
|  | 18 | SiC | 0.1 | $1.8 \times 10^{-4}$ | 250 | 10 | 200 | 3 | 0.5 | 4 | 1.4 | 4–5 | 4–5 |
|  | 19 | Cordierite | 0.3 | $1.8 \times 10^{-4}$ | 250 | 10 | 200 | 3 | 0.5 | 4 | 1.4 | 6–7 | 4–5 |
|  | 20 | $Al_2O_3$ | 0.5 | $2.0 \times 10^{-4}$ | 200 | 10 | 200 | 10 | 0.5 | 4 | 1.4 | 8–9 | 7–8 |
|  | 21 | $Al_2O_3$ | 0.5 | $2.0 \times 10^{-4}$ | 250 | 10 | 200 | 10 | 0.5 | 4 | 1.4 | ≧8.5 | 7–8 |
| Comp. Ex. | 1 | $Al_2O_3$ | 0.5 | $2.0 \times 10^{-4}$ | Room | 10 | 200 | 10 | 0.5 | 4 | 1.4 | 1–2 | 0 |
|  | 2 | $Al_2O_3$ | 0.5 | $2.0 \times 10^{-4}$ | 200 | — | — | — | 0.5 | 4 | 1.4 | 3–4 | 0–1 |

In the above Table, the sign "≧" means that a value exceeding "8.5" causes the substrate to be damaged and no exact value ca be measured.

From the above Table, it should be appreciated that in the respective Examples according to the present invention the utilizable strength can be well attained even when pyrex is employed for the substrate, and that the use of $Al_2O_3$ shows an extremely high bonding strength. In the Examples of the present invention, further, it has been found that the blister occurs only slightly or is substantially absent, whereas in Comparative Examples 1 and 2 it has been found that the utilizable bonding strength has not been attained generally, many blisters are present and their products are practically not utilizable.

The bonding strength (or adherence) has been further tested with respect to the copper layer formed on the alumina substrate by heating the substrate to 200° C., applying the power of 200 W and irradiating ions for 5 minutes, and with the surface roughness of the layer varied in a range of 0.005 to 0.5 μm, and it has been able to confirm that the strength generally satisfiable can be attained so long as the surface roughness is within this range, as shown in FIG. 1. Accordingly, it should be appreciated that a circuit board prepared with the inorganic substrate having the copper layer within this range makes it possible to remarkably reduce the high frequency loss and to expand the extent of practical use.

Figure 2:
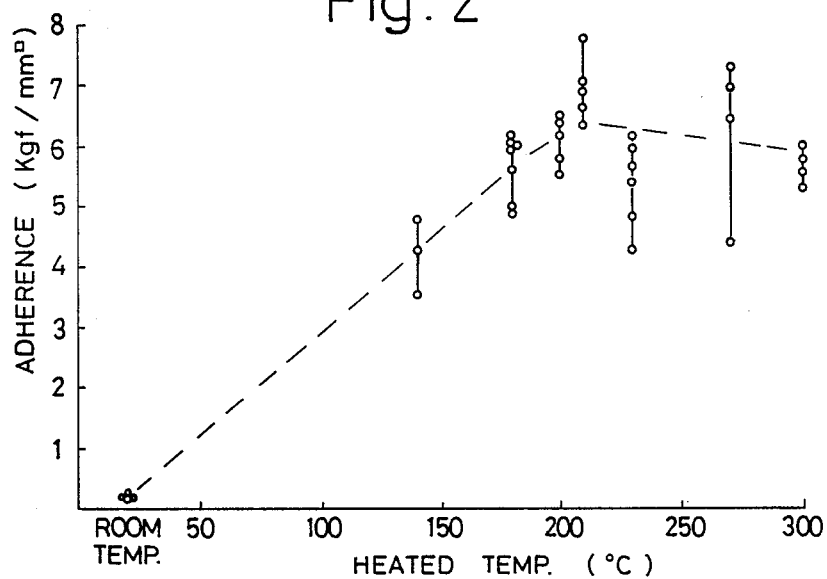
FIG. 2 is a diagram showing the relationship between the temperature of the inorganic substrate and the bonding strength in the method according to the present invention.

The bonding strength has been further tested with the heating temperature variously changed upon the ion irradiation, i.e., the ion bombardment with respect to the substrate within the vacuum vessel of the sputtering device, and it has been found that an excellent bonding strength can be attained when the heating temperature is within a range of 140° to 300° C., as shown in FIG. 2.

In carrying out these tests of the bonding strength, the foregoing magnetron type sputtering device SPF-313H has been employed.

Figure 3:
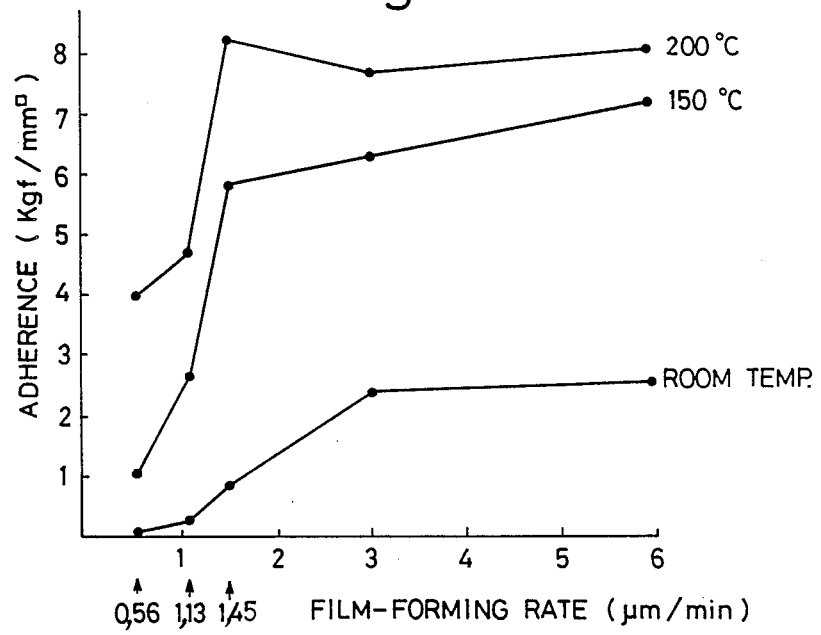
FIG. 3 is a diagram showing the relationship between the conducting metal film forming rate on the inorganic substrate and the bonding strength.

When the bonding strength was tested with the film forming rate varied widely upon carrying out the sputtering process with respect to the substrate, it has been found that the effective bonding strength can be attained so long as the film forming rate is above 1.4 μm/min. as shown in FIG. 3. Such film forming rate is attainable by controlling the DC power density in a range of 10 to 50 w/cm².

EXAMPLE 22

An alumina plate by a Japanese manufacturer KYOCERA of the purity of 99.5%, 0.635 mm thick and 3 inches square was prepared as the inorganic substrate, this alumina plate was placed in the vacuum vessel of the sputtering device in the same manner as in Example 1, and the substrate was heated to 200° C., while the vessel was made to be at a degree of vacuum of $1.2 \times 10^{-4}$ Pa. Then, Ar gas was led into the vacuum vessel under a pressure of 10 Pa, a high frequency power of 13 MHz was applied to the alumina substrate at the power of 200 W for 10 minutes, thereafter the high frequency was interrupted and the Ar gas pressure was regulated to be 0.5 Pa. Next, the DC power of 5 KW was applied to the alumina substrate with an oxygen-less copper employed as a target. A copper layer of the final thickness 10 μm was formed on the substrate at a film forming rate of 1.4 μm/min. while applying a high frequency biasing with an application of a high frequency of 150 W at 13 MHz to the substrate at the same time of starting the discharge.

Thereafter, as shown in FIG. 4, the alumina substrate 10 having on both side surfaces the copper layers 11 and 12 was subjected to a photolithography with respect to one 11 of these layers with a liquid resist employed to form a conductor pattern, and the transmission loss was measured in respect of the conductor pattern at positions of different transmission lengths, with an characteristic impedance set to be 50Ω.

Figure 5:
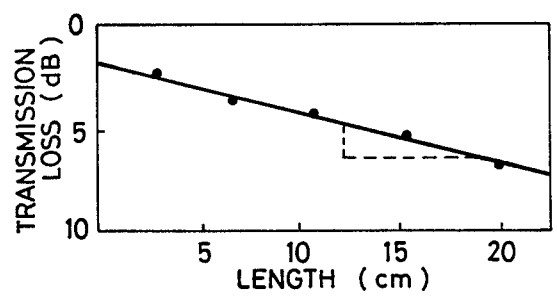
FIGS. 5 and 6 are diagrams showing high frequency characteristics in the working aspect of FIG. 4.
Figure 6:
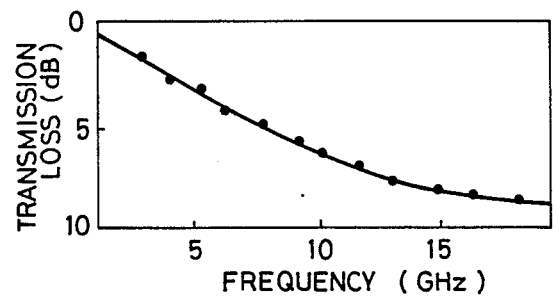

As will be clear from FIG. 5 showing the results of the measurement of the transmission loss with respect to the different length of the conductor strip, the transmission loss has been found to be variable substantially linearly with respect to the length. Further, in FIG. 6, there is shown the transmission loss with respect to the frequency in a range of 100 MHz to 16 GHz, from which it has been found that the transmission loss is also variable substantially linearly with respect to the frequency. This transmission loss is 0.03 dB/cm at 10 GHz and about 0.06 dB/cm at 20 GHz so as to be sufficiently small enough for being useful in practice. Further, the bonding strength of the copper layer with respect to the alumina substrate is shown to be more than 7 $Kg^5$ in contrast to that of 3 $Kg^5$ per 2 mm sqyare in the conventional case, so as to be sufficiently satisfiable.

Figure 8:
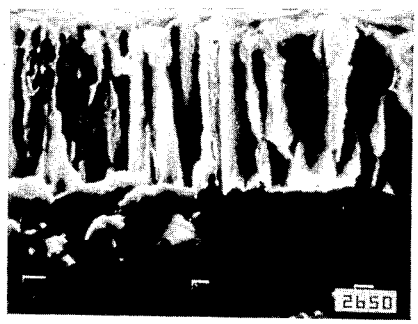
FIG. 8 is a microscopic photograph of an alumina substrate on which a conducting metal layer is formed through a conventional method.
Figure 9:
FIG. 9 is a microscopic photograph of an alumina substrate having a conducting metal layer formed according to the method of the present invention.

An investigation by means of a permeable electronic microscope of 100,000 magnification of boundary surface between the alumina substrate and the copper layer formed thereon according to the present Example has proved the absence of any copper oxide. Such absence of any contamination (oxygen, water, copper oxide) at the boundary surface makes it possible to maintain vacuum sealing at the boundary surface, and the bonding strength is considered to be sufficiently well maintained resisting against any strain due to the internal stress in the copper layer. Generally, the copper layer formed on the alumina substrate by means of a known forming method has been porous as seen in FIG. 8 due to the blisters and the like, whereas the copper layer formed according to the method of the present invention does not produce any blister or the like as seen in FIG. 9 and shows to be intimately coupled to the alumina substrate as an extremely excellent copper layer formed thereon.

In forming the conducting metal layer on the inorganic substrate in accordance with the present invention, such sputtering device as shown schematically in FIG. 7 may be employed. More specifically, the sputtering device 20 includes a substrate holder 21 for holding the inorganic substrate 10 on bottom surface and for being moved upward and downward with an upward projection of the holder slidably passed through a top side plate 20a of a vacuum vessel. The substrate holder 21 is formed to incorporate therein means 22 for supplying a high frequency power to the inorganic substrate 10, a thermocouple 23 connected to a thermometer, and a heating and cooling means 24. A conducting metal member 26 is placed on, for example, a backing plate 27, to oppose the substrate 10 on the holder 21 with a shutter means 25 removably interposed between them, while a DC power-providing means 28 connected to a DC power source is connected to the conducting metal member 26, and a cooling water pipe means 29 is disposed for feeding and discharging cooling water for the conducting metal member 26 is provided. A vacuum pump (not shown) is to be connected through a connecting pipe 30 to the vacuum vessel of the sputtering device 20, a viewing port 31 is provided at a proper position of the vessel for allowing its interior to be reviewed from the exterior, and a rare gas feed pipe 32 is also provided to this port 31.

With this sputtering device 20, the conducting metal member 26 is disposed below the inorganic substrate 10 held as secured to the bottom face of the holder 21 to oppose from above the conducting metal member 26 with an adjustable gap of 40 to 80 mm by moving up and down the holder 21, whereby conducting metal particles are caused to jump upward from the member 26 disposed below to the inorganic substrate 10 disposed above upon the sputtering operation, while preventing any impurity from being mixed in the conducting metal particles. The arrangement is, therefore, effectively contributive to the elevation of purity of the conducting metal layer formed on the inorganic substrate and thus to the lowering of high frequency loss in the conductor pattern circuit on the substrate. The thermocouple 23 of the substrate holder 21 allows the temperature of the substrate 10 to be controlled all the time, while heating and cooling of the substrate 10 can be quickly realized by such heating means as an electric heater and such cooling means 24 as a cooling water pipe.

The shutter means 25 is so provided as to be interposed between the substrate 10 and the conducting metal member 26 during the ion irradiation, i.e., the ion bombardment, to function as a grounding electrode for the ion discharge with the high frequency power imposed to the substrate 10, and as to be removed from the position of being interposed between the substrate 10 and the conducting metal member 26 during the sputtering so as to have the sputtering operation carried out mostly between the substrate 10 and the member 26 receiving the DC power. In this case, an application of a negative DC voltage across the shutter means 25 and the conducting metal member 26 prior to the sputtering will be effective to cause any oxide layer on the conducting metal member 26 to be removed therefrom and to adhere rather to the shutter means 25, so as to realize a purification of the conducting metal member 26.

It will be readily appreciated by any skilled in the art that, with the foregoing sputtering device 20, the formation of the copper or the like conducting metal layer on the inorganic substrate according to the present invention can be quickly and effectively realized.

What is claimed is:

1. A method for forming a conducting metal layer on an inorganic substrate, the method comprising the steps of providing said inorganic substrate, accommodating the inorganic substrate within a vacuum vessel of a sputtering device, heating within said vacuum vessel the inorganic substrate to a temperature about 140° C. while attaining inside the vacuum vessel a vacuum below $3 \times 10^{-4}$ Pa, leading into the vacuum vessel a rare gas as a discharge gas under a pressure of 2–20 Pa, applying a high frequency power to said heated inorganic substrate with said heated inorganic substrate made as a target within the vacuum vessel for carrying out an ion bombardment for a predetermined time, interrupting said high frequency power application and regulating said rare gas pressure to 0.2–2.0 Pa, and carrying out a sputtering by applying a DC power to a conducting metal member disposed in the vessel as a target so as form a conducting metal film on the inorganic substrate at a rate above 1.4 μm/min.

2. A method according to claim 1 wherein said heating of said inorganic substrate is made at a temperature higher than 180° C.

3. A method according to claim 1 wherein said heating of said inorganic substrate is made at a temperature in the range of 180° to 300° C.

4. A method according to claim 1 wherein said rare gas pressure for said ion bombardment is made in a range of 5 to 10 Pa.

5. A method according to claim 1 wherein said ion bombardment is carried out at a power density in a range of 0.1 to 1.6 W/cm$^2$.

6. A method according to claim 5 wherein said predetermined time for said ion bombardment is in a range of 1 to 10 minutes.

7. A method according to claim 1 wherein said conducting metal member is disposed to oppose said inorganic substrate with a gap in a range of 40 to 80 mm.

8. A method according to claim 1 wherein said rate is in a range of 1.4 to 6 μm/min.

9. A method according to claim 1 wherein said conducting metal member is of an oxygen-less copper of a purity higher than 99.9%.

10. A method according to claim 1 wherein said inorganic substrate has a surface roughness made in a range of 0.005 to 0.1 μm by means of an abrasion.

11. A method according to claim 1 which further comprises a step of preliminarily heating said inorganic substrate at a temperature in a range of 900° to 1,200° C. for more than 2 hours.

12. A method according to claim 1 wherein said sputtering is carried out with an application of a high frequency biasing.

13. A method according to claim 12 wherein said high frequency biasing is carried out at a power density of 0.1 to 1.6 W/cm$^2$.

* * * * *